(12) United States Patent
Arai et al.

(10) Patent No.: US 6,433,716 B2
(45) Date of Patent: Aug. 13, 2002

(54) DATA CONVERSION DEVICE HAVING MEDIATOR FOR DETERMINING DATA CONVERSION ORDER

(75) Inventors: Soichiro Arai; Hirofumi Isomura, both of Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/781,965

(22) Filed: Feb. 14, 2001

(30) Foreign Application Priority Data

Feb. 25, 2000 (JP) ........................................ 2000-049783

(51) Int. Cl.$^7$ ............................. H03M 1/00; H03M 1/12
(52) U.S. Cl. ........................................ 341/141; 341/155
(58) Field of Search .............................. 341/141, 155, 341/159, 163; 348/425.3; 704/500

(56) References Cited

U.S. PATENT DOCUMENTS 5,168,276 A * 12/1992 Huston et al. ............... 341/141
5,172,116 A * 12/1992 Noma ......................... 341/141
5,302,952 A * 4/1994 Campbell et al. ............ 341/155
6,268,820 B1 * 7/2001 Sherry et al. ................ 341/155

FOREIGN PATENT DOCUMENTS

JP 2-271719 11/1990
JP 3-225054 10/1991

* cited by examiner

Primary Examiner—Patrick Wamsley
(74) Attorney, Agent, or Firm—Nixon & Vanderhye P.C.

(57) ABSTRACT

A data conversion device for converting analog data to digital data, or digital data to analog data, is composed of a data converter, and a mediator. Plural data groups are fed to the data converter that coverts the data, group by group, upon receipt of a request for converting a particular data group. If plural requests are simultaneously made, the mediator makes mediation among the plural requests to select a data group to be first converted and to set a priority order. A function uniquely corresponding to a combination of the plural requests is generated in the mediator, and the mediation is performed based on the generated function with reference to a preinstalled table showing a relation between the function and the request to be selected.

18 Claims, 6 Drawing Sheets

FIG. 3

| Rm ··· R2 R1 | REQUEST TO BE SELECTED |
|---|---|
| 0 ··· 0 0 | - |
| 0 ··· 0 1 | R1 |
| 0 ··· 1 0 | R2 |
| 0 ··· 1 1 | R2 |
| ⋮ | |
| 1 ··· 1 1 | Rm |

HIGH ⟵ PRIORITY ⟶ LOW

| F | R3 | R2 | R1 | REQUEST TO BE SELECTED |
|---|----|----|----|------------------------|
| 0 | 0  | 0  | 0  | -                      |
| 1 | 0  | 0  | 1  | R1                     |
| 2 | 0  | 1  | 0  | R2                     |
| 3 | 0  | 1  | 1  | R2                     |
| 4 | 1  | 0  | 0  | R3                     |
| 5 | 1  | 0  | 1  | R3                     |
| 6 | 1  | 1  | 0  | R3                     |
| 7 | 1  | 1  | 1  | R3                     |

DATA CONVERSION DEVICE HAVING MEDIATOR FOR DETERMINING DATA CONVERSION ORDER

CROSS-REFERENCE TO RELATED APPLICATION

This application is based upon and claims benefit of priority of Japanese Patent Application No. 2000-49783 filed on Feb. 25, 2000, the content of which is incorporated herein by reference.

BACKGROUND OF THE INVENTION

1. Field of the Invention

The present invention relates to a data conversion device which converts analog data to digital data, or digital data to analog data, and more particularly to such a conversion device that includes a mediator for determining a priority order of data conversion when plural requests for converting various sets of data are simultaneously made.

2. Description of Related Art

In an electronic control system for use in a recent automotive vehicle, various analog data to be converted into digital data are fed into an electronic control unit in the system. The analog data are sequentially converted into digital data according to requests for conversion. When plural requests for converting plural groups of analog data are simultaneously made, mediation for determining a priority order among the plural requests is made according to a predetermined rule.

An example of such mediation is described in JP-A-3-225054. In this example, when plural requests for converting plural groups of analog data into digital data are made, the conversion is performed group by group, allocating a short period of time to each group. More particularly, a flag signal "1" is given when a request for converting a certain group of data is made, and flag signal "0" is given when no request is made. Such flag signals for all requests are stored in a memory. The groups of analog data corresponding to the flag signal "1" are sequentially converted into digital data group by group according to a predetermined priority order. In this process, it is necessary to search each request as to whether its flag is "1" or "0".

FIG. 7 shows the process of searching the flag signals in the above example. The flag signals stored in the memory are searched one by one according to a predetermined priority order of the requests. This searching loop is repeated until a flag "1" is found. Upon finding the flag "1", the corresponding analog data group is selected as a data group to be converted. If no flag "1" is found throughout the search, the process moves out of the searching loop. Since the flag search is performed one by one until a flag "1" is found, it consumes time. That is, if a flag "1" is found at the $i^{th}$ loop and one loop requires Tr nanoseconds, (Tr×i) nanoseconds are consumed for that search. If a flag "1" is found at the request having the lowest priority, the searching loop has to be repeated for all the requests.

Since the number of requests (the number of analog data groups to be converted into digital data) tends to increase in recent electronic control systems, it is a major problem that a long time is consumed for mediating the requests in the data conversion process. The same problem exists in a data conversion device for converting digital data to analog data.

SUMMARY OF THE INVENTION

The present invention has been made in view of the above-mentioned problem, and an object of the present invention is to provide an improved data conversion device in which the mediation among plural requests is quickly performed thereby to speed up the data conversion. Another object of the present invention is to provide a method for efficiently making mediation among the plural requests for data conversion.

The data conversion device according to the present invention is composed of a data converter and a mediator. Plural analog data groups to be converted into digital data are fed into the data converter, and an analog data group is converted group by group according to a request for conversion. If plural requests for conversion are simultaneously made, it is necessary to make mediation among the plural requests to select a data group to be first converted and to set a priority order. The mediator of the present invention performs such mediation. The data converter converts the analog data of the selected group into digital data according to the priority order determined by the mediator.

All the requests (Ri) for conversion are given respective priority orders. Further, when a certain request is actually made, a flag signal "1" is given to the request (Ri=1), and a flag signal "0" is given when no request is made (Ri=0). Each request (Ri) is weighted with a $j^{th}$ power of 2, and all the weighted requests are summed up. In other words, a function (F) corresponding to a combination of all the requests (Ri) is generated according to the following formula: $F=\Sigma(2^j \times Ri)$, where i and j are integers different from each other. On the other hand, a table showing a relation between the function (F) and a request to be selected is preinstalled in the mediator. The mediator selects the data group to be converted, based on the function (F) by referring to the table.

Since the function (F) uniquely corresponds to each combination of all the requests, the request to be selected is easily and quickly determined based on the function (F). Various forms of the function (F) may be used for the mediation purpose, as long as the function (F) uniquely corresponds to a respective combination of requests (Ri). If the function (F) is formulated by summing up the requests (Ri) weighted with $j^{th}$ power of 2, as mentioned above, the mediator can be structured in a simple form, even in a hardware form. As the weighting factor of requests (Ri), $2^{(i-1)}$ may be used in place of $2^j$. The present invention may be similarly applied to a data converter for converting digital data to analog data.

According to the present invention, a request for data conversion having a higher priority is quickly selected from among plural requests through the mediation without searching all the requests one by one. Therefore, data conversion can be performed in a higher speed.

Other objects and features of the present invention will become more readily apparent from a better understanding of the preferred embodiment described below with reference to the following drawings.

BRIEF DESCRIPTION OF THE DRAWINGS

FIG. 3 is an example of a table for selecting requests in the mediation process;

DETAILED DESCRIPTION OF THE PREFERRED EMBODIMENT

Figure 1:
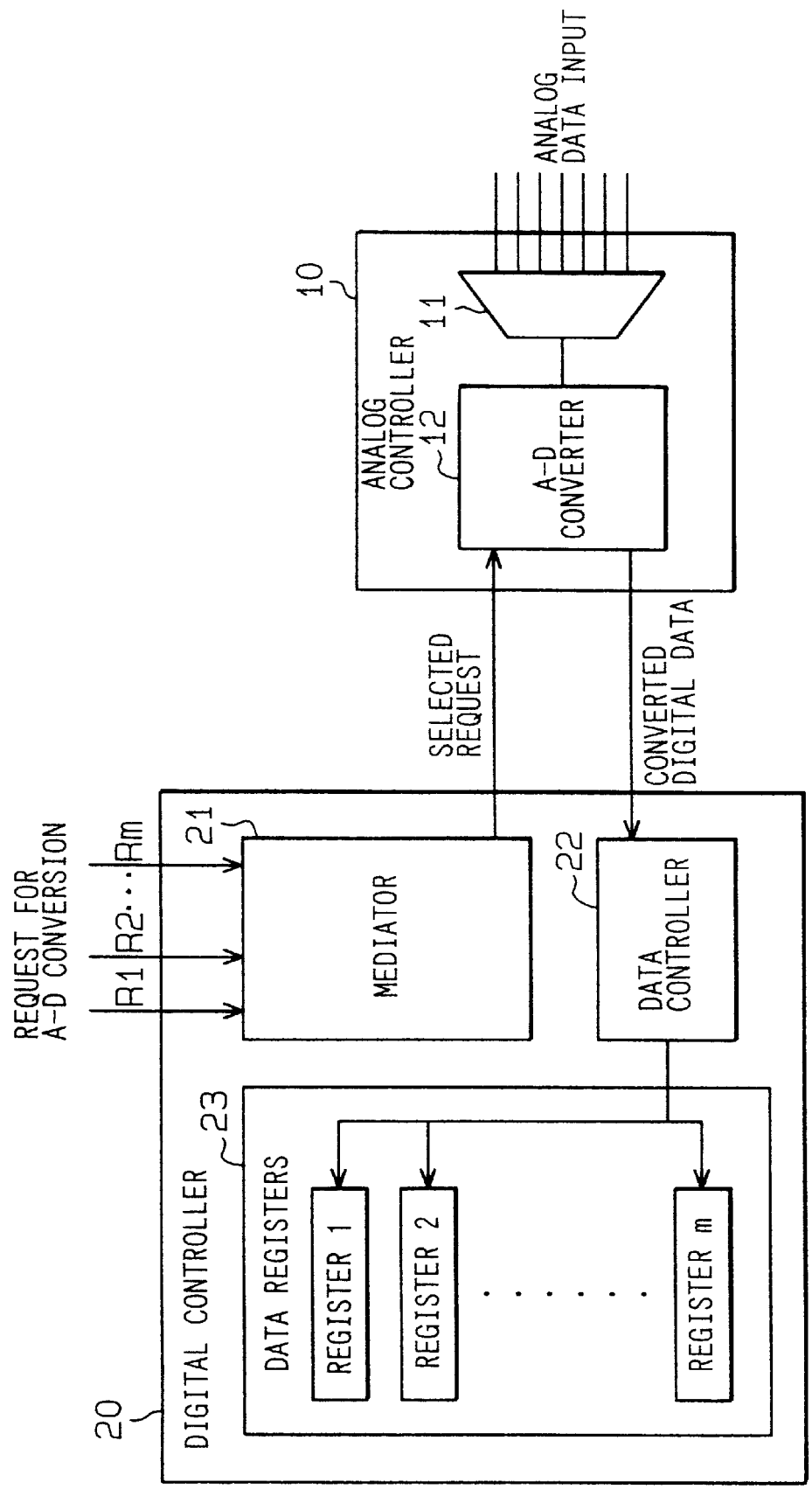
FIG. 1 is a block diagram showing a device for converting analog data into digital data according to the present invention.

With reference to FIGS. 1 to 5, a preferred embodiment of the present invention will be described. FIG. 1 shows a data conversion device that converts various analog data fed thereto into digital data in an order determined by mediation among plural requests for conversion. The conversion device is composed of an analog controller 10 that converts analog data inputs into digital data and a digital controller 20 that instructs an order of data conversion to the analog controller 10 and stores the converted digital data therein. The analog controller 10 includes a multiplexer 11 and an A-D converter 12. The digital controller 20 includes a mediator 21, a data controller 22 and data registers 23.

The multiplexer 11 receives plural groups of analog data and outputs a group of analog data which is instructed to be output from time to time. The A-D converter 12 converts the analog data supplied from the multiplexer 11 into digital data.

Requests for data conversion R1, R2 ... Rm, each of which indicates an analog data group to be converted into digital data, are input to the mediator 21. The requests for conversion are generated in devices (not shown) such as a microcomputer or an interface logic in the system. Each request is stored in the mediator 21 in a form of a flag signal "1" or "0". The flag signal "1" indicates that a request is made and the flag signal "0" indicates that no request is made. It is highly possible that plural requests are made at a same time, because requests generated in various devices may be fed at the same time, or an interrupting request may be made. The mediator 21 selects one request from among plural requests based on a predetermined request priority order when there are plural requests at a same time. The selected request is fed to the A-D converter 12. Details of the mediator 21 will be described later.

The data controller 22 receives converted digital data from the A-D converter 12. The converted digital data are stored in the data registers 23 consisting of m registers, register 1, register 2 ... register m. Each group of converted digital data is stored in a corresponding register, i.e., a digital data group converted according to a request Ri is stored in the register i. Devices in the system, such as a microcomputer, read out the digital data stored in the data registers 23.

Figure 2:
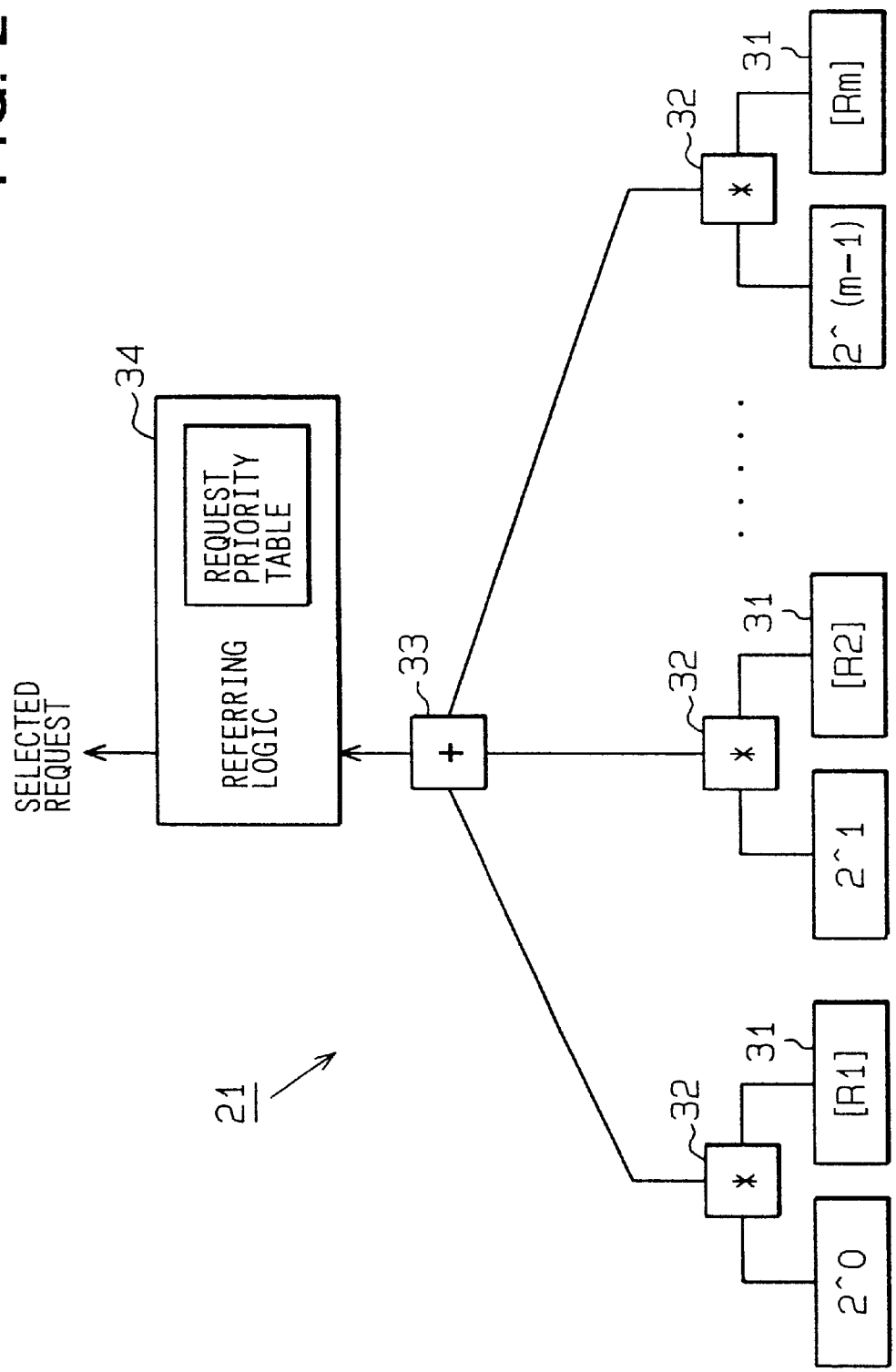
FIG. 2 is a chart showing a mediation process in the data conversion device according to the present invention.

Referring to FIG. 2, the structure and operation of the mediator 21 will be described. The mediator 21 includes memories 31 for storing the flag signals, multiplying logics 32, an adding logic 33, and a referring logic 34. The flag signals of all the requests R1 to Rm are stored in the corresponding memories 31, respectively. In the multiplying logic 32, the flag signal corresponding to each request Ri is processed according to the following formula to generate a value Gi: $Gi=2^{(i-1)} \times Ri$ (Ri=1 or 0; i=1 to m). All the values Gi calculated in each multiplying logic 32 are summed up in the adding logic 33, thereby to generate a function F: $F=\Sigma Gi=(2^0 \times R1)+(2^1 \times R2) \ldots +(2^{(m-1)} \times Rm)$. A value of the function F uniquely corresponds to a given combination of all the requests R1 to Rm. Since the flag signals of Ri, 1 or 0, are weighted with (i-1)th power of 2, the adding process can be easily carried out in the adding logic 33 by shifting bit calculation to left or right.

The calculated value of the function F is fed into the referring logic 34 that contains a request priority table therein. An example of the request priority table is shown in FIG. 3. In this table, the flag signal (1 or 0) corresponding to each request (R1 to Rm) and a request to be selected according to a particular value of the function F are listed. It is predetermined, in this exemplary table, that a request having a higher suffix has a higher priority, i.e., the priority of request R1 is the lowest and that of request Rm is the highest. However, the order of priority may be arbitrarily set, not limited to the order exemplified. The referring logic 34 selects one request having the highest priority from among requests having the flag signal "1", based on the value of the function F, referring to the request priority table. Each logic included in the mediator 21 may be structured in a hardware or in a software.

Figure 4:
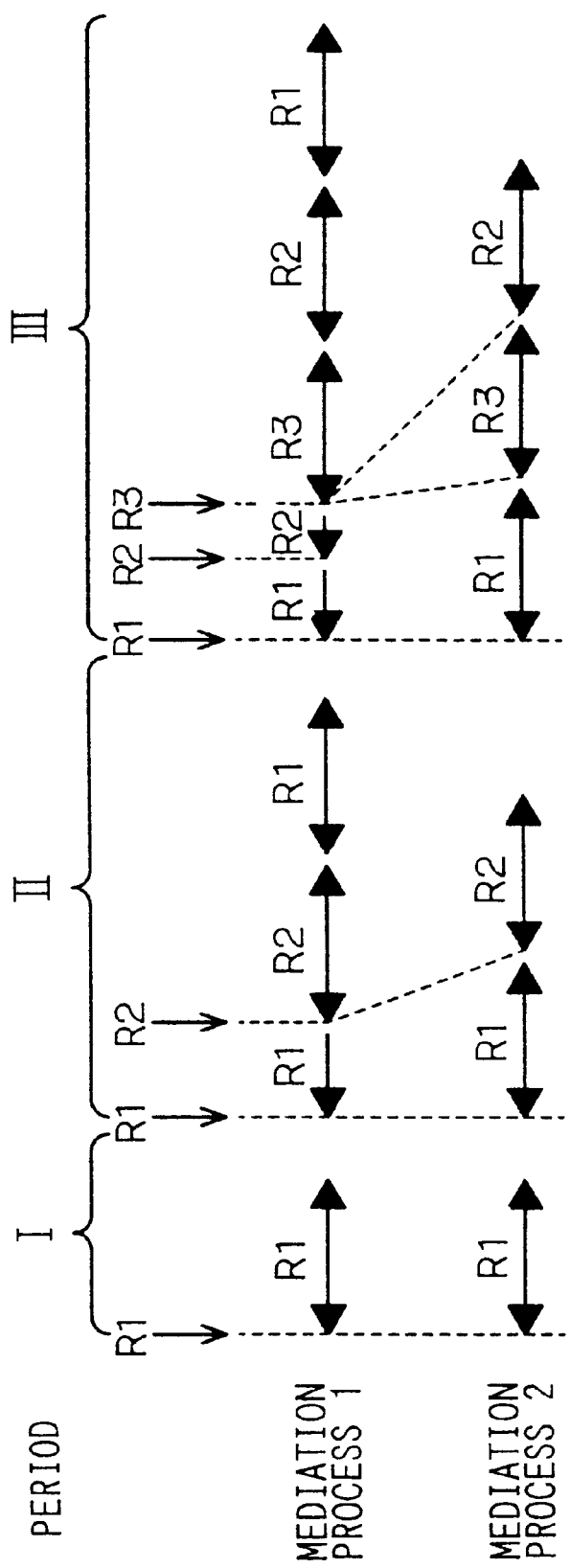
FIG. 4 is a time chart showing a data conversion process carried out according to the mediation of the present invention.
Figures 5, 6:
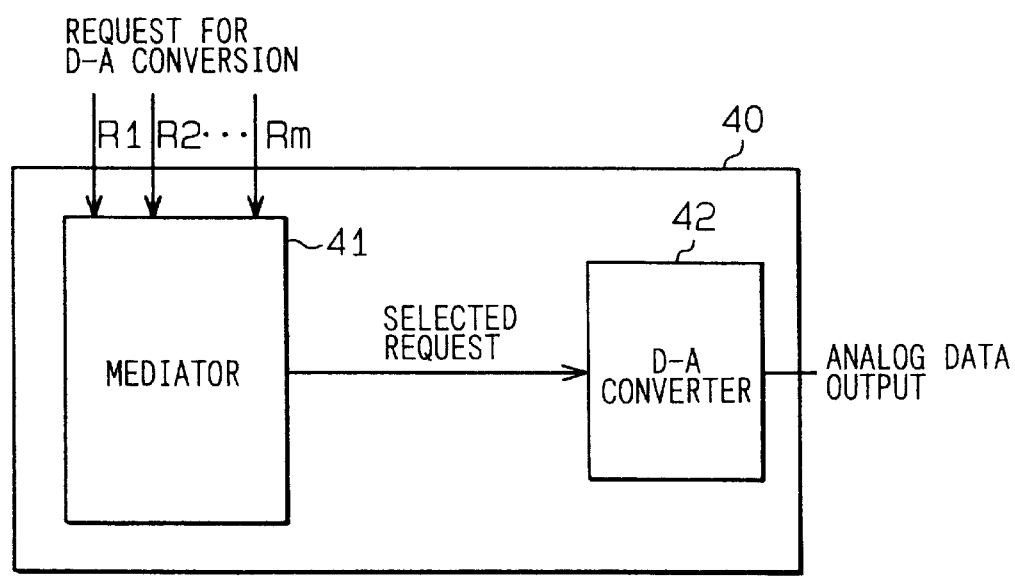
FIG. 5 is a table for selecting requests in the mediation process, the table being simplified for explanation purpose.
FIG. 6 is a block diagram briefly showing a device for converting digital data into analog data.
Figure 7:
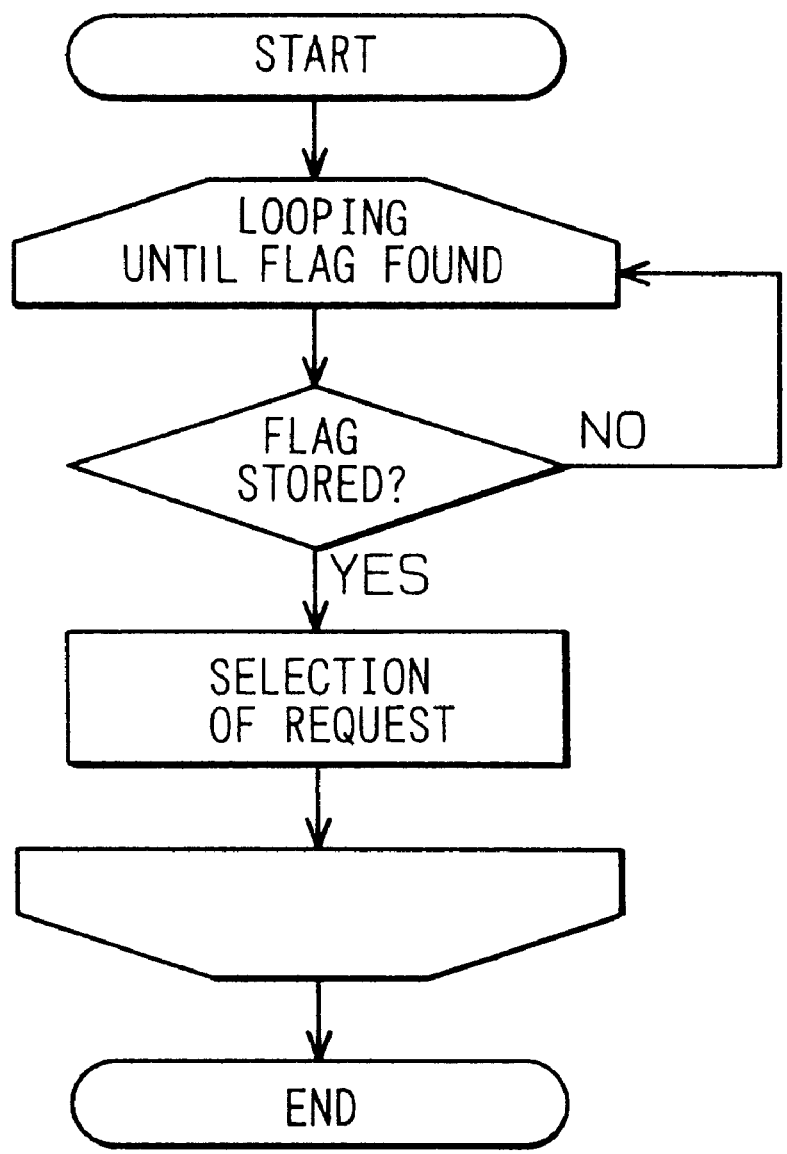
FIG. 7 is a flowchart showing a process of selecting a request in a conventional device.

To further clarify the operation of the mediator 21 described above, a simplified example which handles only three requests R1, R2 and R3 will be described below with reference to FIGS. 4 and 5. In this example, it is predetermined that R3 has the highest priority, R1 the lowest and R2 intermediate. The values of the function F are calculated as shown in FIG. 5 for each combination of request flags. For example, the function value 5 corresponds to a request combination (R1=1, R2=0, R3=1; $F=1 \times 2^0+0 \times 2^1+1 \times 2^2=5$). When the function F is calculated as 5, the request R3 is selected because R1 and R3 have the flag "1" and R3 has a higher priority than R1.

Now, referring to FIG. 4, the timing of the data conversion will be described, taking the same example shown in FIG. 5. The timing chart of FIG. 4 shows two mediation processes, mediation process 1 and mediation process 2. In the timing chart, vertical arrows pointing downward show the timing of a conversion request is made, and the length of each horizontal arrow shows a period of time during which data conversion is carried out.

First, the conversion operation carried out under mediation process 1 will be described. Upon receipt of a request, the mediator 21 immediately performs mediation and the data corresponding to a selected request are converted into digital data. If a new request is made during a period in which the conversion is being performed, a mediation between the former request and the new request is done, and the data corresponding to the selected request as a result of the mediation are converted, interrupting the former data conversion.

Some particular examples under mediation process 1 will be explained with reference to the timing chart. In period I, upon receipt of request R1 (no other requests are made), the mediator 21 selects request Ri based on the value of function F (F=1, indicating to select R1 as shown in FIG. 5). The data corresponding to request R1 are converted immediately following the mediation. In period II, a new request R2 is made during the data corresponding to request R1 are being converted. A mediation between R1 and R2 is Las carried out upon receipt of R2, and R2 is selected based on the F value (F=3, indicating to select R2 as shown in FIG. 5). At this point, the data conversion corresponding to R1 is interrupted and the data conversion corresponding to R2 is carried out. Upon completion of the data conversion corresponding to R2 (R2 disappears at this point), request R1 is again selected based on the F value (F=1, indicating to select R1). At this point, the interrupted data conversion corresponding to R1 is resumed again. In period III, R1 is interrupted upon receipt of R2 in the same manner as in period II, and further, R2 is interrupted upon receipt of R3. At the time of the interruption of R2, request R3 having the highest priority is processed, then the data conversion corresponding to R2 and R3 follows in this order.

Under mediation process 2, the data conversion which is being carried out according to a selected request is not interrupted, as opposed to that under mediation process 1. In other words, the data conversion is sequentially carried out according to each selected request. In period I, R1 is selected in the mediation and processed in the same manner as in mediation process 1. In period II, the data conversion corresponding to R1 is not interrupted by input of R2. The mediation between R1 and R2 is not done at that point, but it is done after completion of the conversion process corresponding to R1. In period III, R1 is not interrupted by R3 even though R3 has a higher priority than R1. After completion of R1 conversion, a mediation is performed to select R3. Similarly, during the R3 conversion no mediation is made, and only after the R3 conversion is completed, the next mediation is performed.

Advantages of the present invention are summarized as follows. Since a combination of plural requests for data conversion is represented by the function F which is unique to that combination, a request having the highest priority among plural requests can be quickly selected based on the function F. It is not necessary to search a request to be selected by repeating a searching loop as done in the conventional device. Therefore, the mediation process is much simplified and time required for the mediation is considerably shortened.

Since the function F is formulated in a simple form that includes only multiplication and addition, the function F can be calculated in a simple process. Therefore, the mediator 21 can be composed of the multiplying logics 32, the adding logic 33 and the referring logic 34. Those logics can be realized in a hardware structure. In addition, since the multiplication is performed in plural multiplying logics 32, each corresponding to each request, the multiplication process requires only a short period of time.

Since the priority order of the requests is determined based on the function F, referring to the table preinstalled in the mediator 21, the determination can be carried out in a simple process. Further, since the table can be revised, the priority order of the request can be easily changed according to particular needs. Also, since the table is installed in the mediator 21, information regarding the priority order can be kept secret against third parties.

The present invention may be modified into various forms. For example, the function F expressed in the formula, $F=\Sigma(2^{(i-1)} \times Ri)$ in the foregoing embodiment may be modified to the following formula: $F=\Sigma(2^{(i-k)} \times Ri)$, where k is an integer. Alternatively, the following function may be used: $F=\Sigma(2^j \times Ri)$, where j is an integer and $j \neq i$. Further, as long as the value of the function F uniquely corresponds to a combination of requests Ri, any function expressed in a form other than the above form may also be used.

Though an analog-to-digital conversion device is shown in the foregoing embodiment, the present invention is also applicable to a digital-to-analog conversion device in a similar manner. FIG. 6 briefly shows a D-A conversion device 40 to which the present invention is applied. Requests Ri (R1 to Rm) for converting digital data to analog data are fed to a mediator 41 and stored therein as flag signals, "1" or "0". The same function F as explained in the above embodiment is similarly generated in the mediator 41. The priority order among the plural requests R1 is determined based on the value of the function F by referring to the request priority table, in the same manner as explained in the foregoing embodiment. The selected request in the mediator 41 is fed into a D-A converter 42 which outputs converted analog data. In this D-A conversion device 40, too, the same advantages obtained in the A-D conversion device described above are attained.

It is also possible to realize the function F in a Field Programmable Gate Array (FPGA) contained in the mediator 21 or 41 and to arbitrarily rewrite the form of the function F.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A data conversion device for converting data between analog and digital, the data conversion device comprising:
    a mediator for selecting a data group to be converted from among a plurality of data groups which are requested to be converted, each request having a respective priority order being stored in the mediator as a flag signal,
    said mediator generating a value based on a function representing a combination of requests calculated using the priority order,
    said mediator determining the data group currently to be converted based on the current value of the function; and
    a data converter connected to the mediator for converting the data group selected by the mediator;
        wherein the possible values of the function uniquely corresponds to each possible combination of the plurality of requests,
        wherein the mediator includes a table defining a relation between the value of the function and the priority order of the requests; and
        wherein the mediator determines the data group to be converted by referring to the table.

2. A data conversion device as in claim 1, wherein:
    the function (F) can be expressed by a formula $F=G1+G2+ \ldots +Gm$, where $Gi=(2^j \times Ri)$, Ri is a flag signal having value 1 or 0, i is an integer, 1 to m, and j is an integer having a value which is different from that of each i.

3. A data conversion device as in claim 2 wherein:
    the mediator comprises a plurality of multiplying logics circuits MLi, each circuit MLi calculating a value Gi for each Ri; an adding logic circuit ALi calculating the value of F by adding all of Gi; and a mediating logic circuit selecting the data group to be converted according to the priority order.

4. A method of selecting an analog data group to be converted into digital data from among a plurality of analog data groups, when a plurality of requests for converting respectively different analog data groups are simultaneously made, the method comprising:
    giving a priority order to all the requests (Ri);
    generating the value of a function (F) uniquely representing the plurality of requests;
    forming a table defining a unique relation between the data group to be selected and the value of the function (F); and determining the data group currently to be selected based on the current value of the function (F) by referring to the table.

5. A method of selecting an analog data group as in claim 4, wherein:

each request (Ri) is represented by a flag signal of value "1" when the request is made and by a flag signal of value "0" when the request is not made.

6. A method of selecting an analog data group as in claim 5, wherein the function (F) can be expressed by a formula: $F=\Sigma(2^j \times Ri)$, where i and j are integers, and j has a value which is different from that of each i.

7. A method of selecting an analog data group as in claim 6, wherein the integer j is (i−1).

8. A data conversion device for converting analog data to digital data, the data conversion device comprising:

a mediator for selecting an analog data group to be converted to a digital data group from among a plurality of analog data groups which are requested to be converted, said mediator including a respective priority order data store for each request;

said mediator defining a function representing a value uniquely corresponding to each possible combination of requests that is calculated using the priority order, said mediator determining the analog data group to be converted based on the calculated value of the function and a table showing a relation between the value of the function and the priority order of the requests;

a multiplexer to which the plurality of analog data groups are fed, the multiplexer selectively outputting the analog data group to be converted according to a determination output of the mediator; and an analog-digital converter for converting the analog data group outputted from the multiplexer to a digital data group.

9. A data conversion device as in claim 8 wherein:

the function (F) can be expressed by the formula $F=G1+G2+ \ldots +Gm$, where $Gi=(2^j \times Ri)$, Ri is a flag signal having value 1 or 0, i is an integer, 1 to m, and j is an integer having a value which is different from that of each i.

10. A data conversion device as in claim 9 wherein:

the mediator comprises a plurality of multiplying logic circuits MLi, each circuit MLi calculating a value Gi for each Ri; an adding logic circuit ALi calculating the value of F by adding all of Gi, and a mediating logic circuit selecting the data group to be converted according to the priority order.

11. A method for quickly and dynamically selecting one of plural input data for A/D or D/A conversion in response to competing requests for data conversion where different input data are assigned respectively different relative priority values and where the time periods required to satisfy competing requests may overlap, said method comprising:

(a) storing a selection value uniquely representing each possible combination of competing requests for data conversion in association with selection data identifying the input data to be selected for conversion when that respectively associated combination of competing requests occurs;

(b) generating a current one of said selection values in response to currently active request(s) for data conversion;

(c) using said generated current selection value to locate a corresponding stored selection value and its respectively associated selection data; and (d) using said located selection data to choose input data for conversion.

12. A method as in claim 11 wherein (b), (c) and (d) are repeated at the conclusion of data conversion for a then selected input data.

13. A method as in claim 12 wherein (b), (c) and (d) are repeated only at the conclusion of data conversion for a then selected input data.

14. A method as in claim 11 wherein (b), (c) and (d) are repeated each time a new request for data conversion occurs.

15. Apparatus for quickly and dynamically selecting one of plural input data for A/D or D/A conversion in response to competing requests for data conversion where different input data are assigned respectively different relative priority values and where the time periods required to satisfy competing requests may overlap, said apparatus comprising:

(a) means for storing a selection value uniquely representing each possible combination of competing requests for data conversion in association with selection data identifying the input data to be selected for conversion when that respectively associated combination of competing requests occurs;

(b) means for generating a current one of said selection values in response to currently active request(s) for data conversion;

(c) means for using said generated current selection value to locate a corresponding stored selection value and its respectively associated selection data; and (d) means for using said located selection data to choose input data for conversion.

16. Apparatus as in claim 15 wherein (b), (c) and (d) are actuated at the conclusion of data conversion for a then selected input data.

17. Apparatus as in claim 16 wherein (b), (c) and(d) are actuated only at the conclusion of data conversion for a then selected input data.

18. Apparatus as in claim 15 wherein (b), (c) and (d) are actuated each time a new request for data conversion occurs.

* * * * *